(12) United States Patent
Yamada

(10) Patent No.: US 6,226,775 B1
(45) Date of Patent: May 1, 2001

(54) SEMICONDUCTOR INTEGRATED CIRCUIT DESIGNING METHOD OF AN INTERCONNECTION THEREOF AND RECORDING MEDIUM IN WHICH THE METHOD IS RECORDED FOR EMPTY AREA

(75) Inventor: Tamotsu Yamada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/139,738

(22) Filed: Aug. 25, 1998

(30) Foreign Application Priority Data

Aug. 25, 1997 (JP) .................................................. 9-228462

(51) Int. Cl.⁷ .................................................. G06F 17/50
(52) U.S. Cl. .................................................. 716/2
(58) Field of Search ........................................... 716/13, 2

(56) References Cited

U.S. PATENT DOCUMENTS 6,002,857 * 12/1999 Ramachandran ........................ 716/13

FOREIGN PATENT DOCUMENTS

| 4-61275 | 2/1992 | (JP) . |
|---|---|---|
| 5-109892 | 4/1993 | (JP) . |
| 6-244387 | 9/1994 | (JP) . |
| 6-326190 | 11/1994 | (JP) . |
| 7-37987 | 2/1995 | (JP) . |

* cited by examiner

*Primary Examiner*—Matthew Smith
*Assistant Examiner*—Thuan Do
(74) *Attorney, Agent, or Firm*—Sughrue, Mion, Zinn, Macpeak & Seas, PLLC

(57) ABSTRACT

At the time of the preparation of the core macro, the empty interconnection area extraction on the core macro is carried out and the fixed passage in the core macro is prepared by using the empty interconnection area. At the time of the chip layout, the interconnection is provided by using the interconnection for the fixed passage in the core macro. Also, at the time of the preparation of the core macro, the fixed passage interconnection in the core macro is set either in the VDD potential or in the GND potential to prepare the delay library of the core macro.

12 Claims, 8 Drawing Sheets

X : ACTUAL TERMINAL

SEMICONDUCTOR INTEGRATED CIRCUIT DESIGNING METHOD OF AN INTERCONNECTION THEREOF AND RECORDING MEDIUM IN WHICH THE METHOD IS RECORDED FOR EMPTY AREA

BACKGROUND OF THE INVENTION

1. Field of the Invention

The present invention relates to a semiconductor integrated circuit and a designing method of an interconnection thereof, and more particularly to a semiconductor integrated circuit using a core macro comprising a plurality of circuits, such as a CPU incorporating peripheral circuits such as a DMA controller, an interruption controller, a timer/counter, a local bus(arbiter, a clock oscillator or the like, and a designing method of an interconnection thereof.

2. Description of the Related Art

FIG. 1 is a top view showing one example of a conventional semiconductor integrated circuit incorporating a core macro. In FIG. 1, a chip 418 is a semiconductor integrated circuit which is provided with a core macro 419 and which is connected with a signal interconnection 420. The core macro 419 is registered as an interconnection inhibition area so that the signal interconnection does not pass thereon.

Next, the designing method of an interconnection of this semiconductor integrated circuit will be explained hereinafter.

In the case where the chip 418 is laid out, the core macro 419 is arranged in the beginning. After that, the signal interconnection 420 is connected in an automatic interconnection. Since the core macro 419 is registered as an interconnection inhibition area in the automatic interconnection, the signal interconnection 420 is connected by making a detour around the core macro 419.

In the aforementioned interconnection method, there is a problem in that since the signal interconnection which makes a detour is concentrated around the core macro 419, the area of the chip 418 is increased.

As a method for improving the aforementioned problem, there is provided an art which is disclosed in Japanese Patent Application Laid-Open No. 5-109892. The art which is disclosed in the aforementioned JP-A will be explained hereinafter.

FIG. 2 is a flowchart showing an automatic interconnection processing for preventing an increase of the chip area which is disclosed in the aforementioned JP-A.

First of all, an outline interconnection processing 522 which takes in consideration the passing interconnection on the core macro will be carried out. Next, on the basis of the passage which is determined in the outline interconnection processing 522, a passage designation processing 523 will be carried out for extracting a partial passage of the outline interconnection passage which passes on the core macro for each of the core macros. Subsequently, with the interconnection processing 524 which passes on the core macro, a detailed interconnection corresponding to the partial passage which has been extracted in the passage designation processing 523 is carried out by using the interconnection which passes on the core macro. In the passage interconnection processing 524 on the core macro, the interconnection layer which is not used at the time of layout design in the core macro is primarily used. After that, a confirmation processing 525 is carried out to confirm whether or not the passage interconnection processing on the core macro has been terminated with respect to all the core macros. When the processing has not been terminated with respect to all the core macros, the process is brought back to the passage interconnection processing 524 on the core macro to carry out the processing with respect to all the core macros which are not processed. In the case where the processing has been terminated with respect to all the core macros, the interconnection processing 526 between channels on the chip level has been carried out thereby terminating a layout design.

FIG. 3 is a top view showing one example of the outline interconnection passage in which the passage interconnection on the core macro has been considered. It is considered that the example shown in FIG. 3 will be laid out. On the chip 626, three core macros 627, 628 and 629 are arranged. The outline interconnection passage which is shown by a dot line with respect to an actual terminal shown by X is considered as passage information.

In the beginning, as an advance processing, a net list which passes through each core macro is extracted from the passage information and is shown as a pin pair collection. In correspondence to this net list, as shown in FIG. 4, a temporary terminal 701 is provided on an external form of each of the core macros.

Next, as shown in FIG. 5, an interconnection is provided on the core macro on the basis of the net list for the passage on the core macro and information for controlling the passage route on the core macro.

Lastly, with respect to each pin pair on which a passage interconnection is successfully provided on the core macro, the temporary terminal 801 is converted into an actual terminal to determine a net list between the core macros.

It becomes possible to reduce the chip area by using the upper part of the core macro as an interconnection area from the aforementioned interconnection method.

However, in the conventional technique which has been described above, the number of interconnections which pass on the core macro for each of the chip layout, and the interconnection passage are different for each of the chip layouts, it becomes necessary to re-create the delay library of the core macro itself under the influence of the adjacent design or the crossing of the passage interconnection. From this point, the following problem will be generated.

The first problem is that when the upper part of the core macro constitutes an interconnection inhibition area in the layout of the chip which incorporates the core macro, the interconnection must be provided by making a detour around the interconnection inhibition area so that the chip area is increased.

The second problem is that it becomes necessary to change a delay library of the core macro for each of the layouts because the signal interconnection in the core macro is affected by the potential of the signal so that the AC characteristic of the core macro is changed when the interconnection is provided by using an empty area on the core macro at the time of the layout.

SUMMARY OF THE INVENTION

An object of the present invention is to reduce a chip area by securing a signal interconnection area in the empty interconnection area on the core macro.

Furthermore, another object of the invention is to prevent the AC characteristic of the core macro from being affected by the signal interconnection at the time of the chip layout by creating the delay library of the core macro in advance.

The designing method of an interconnection of the semiconductor integrated circuit including the core macro according to the present invention comprises the steps of: extracting an empty area inside of a core macro; and carrying out a core macro processing for creating a signal interconnection and its delay library with respect to the extracted empty area.

In this case, the chip layout processing may be included for connecting a signal interconnection which is prepared with respect to the empty area which is extracted in the core macro layout processing and the delay library.

The designing method of an interconnection of the semiconductor integrated circuit according to another embodiment of the present invention is a designing method of an interconnection of the semiconductor integrated circuit for carrying out an interconnection design of the semiconductor integrated circuit in which an interconnection design of a semiconductor integrated circuit including a core macro is carried out, the method comprising: carrying out a layout processing for laying out a core macro on the basis of a net list which has been input; carrying out a processing for extracting an empty interconnection area in which the empty interconnection design area on the core macro which has been laid out is extracted; and carrying out a processing fixed passage interconnection inside of the core macro for creating the interconnection by using the empty interconnection area which is extracted in the processing for extracting the empty interconnection area as the signal interconnection area.

In this case, the designing method of an interconnection may comprise: carrying out a delay library processing for preparing a delay library in which a delay characteristic is described with respect to the core macro in which the interconnection is prepared in the fixed passage interconnection processing inside of the core macro; carrying out a terminal processing for the passage interconnection for providing a terminal for passage interconnection with respect to the interconnection which has been prepared; and carrying out a chip lay out processing for referring to the delay library which is prepared in the delay library processing and carrying out a floor plan and an automatic layout by using the terminal for the passage interconnection which is provided in the processing for the terminal for the passage interconnection and carrying out the signal interconnection.

The semiconductor integrated circuit of the present invention is prepared by determining the interconnection in any of the methods described above.

On the recording medium of the present invention, a program is recorded for allowing a computer to carry out any of the methods.

The semiconductor integrated circuit device and the designing method of an interconnection of the present invention which are constituted in the aforementioned manner comprises means for securing an area in which the signal interconnection can be prepared on the core macro in advance, and means for preparing a delay library of the core macro including the signal interconnection at the time of the preparation of the core macro.

At the time of the core macro design, an interconnection empty area on the core macro is sought out and a metal interconnection is prepared in the area. Then the interconnection empty area is used as a signal interconnection area at the time of the chip layout. As a consequence, the interconnection which makes a detour at the time of the chip layout can be passed on the core macro so that the increase of the chip area can be prevented.

The passage interconnection is prepared on the core macro as a hardware. In that state, the delay library of the core macro is prepared. Consequently, it becomes unnecessary to change the delay library of the core macro for each of the chip layouts.

DESCRIPTION OF THE PREFERRED EMBODIMENTS

Figure 1:
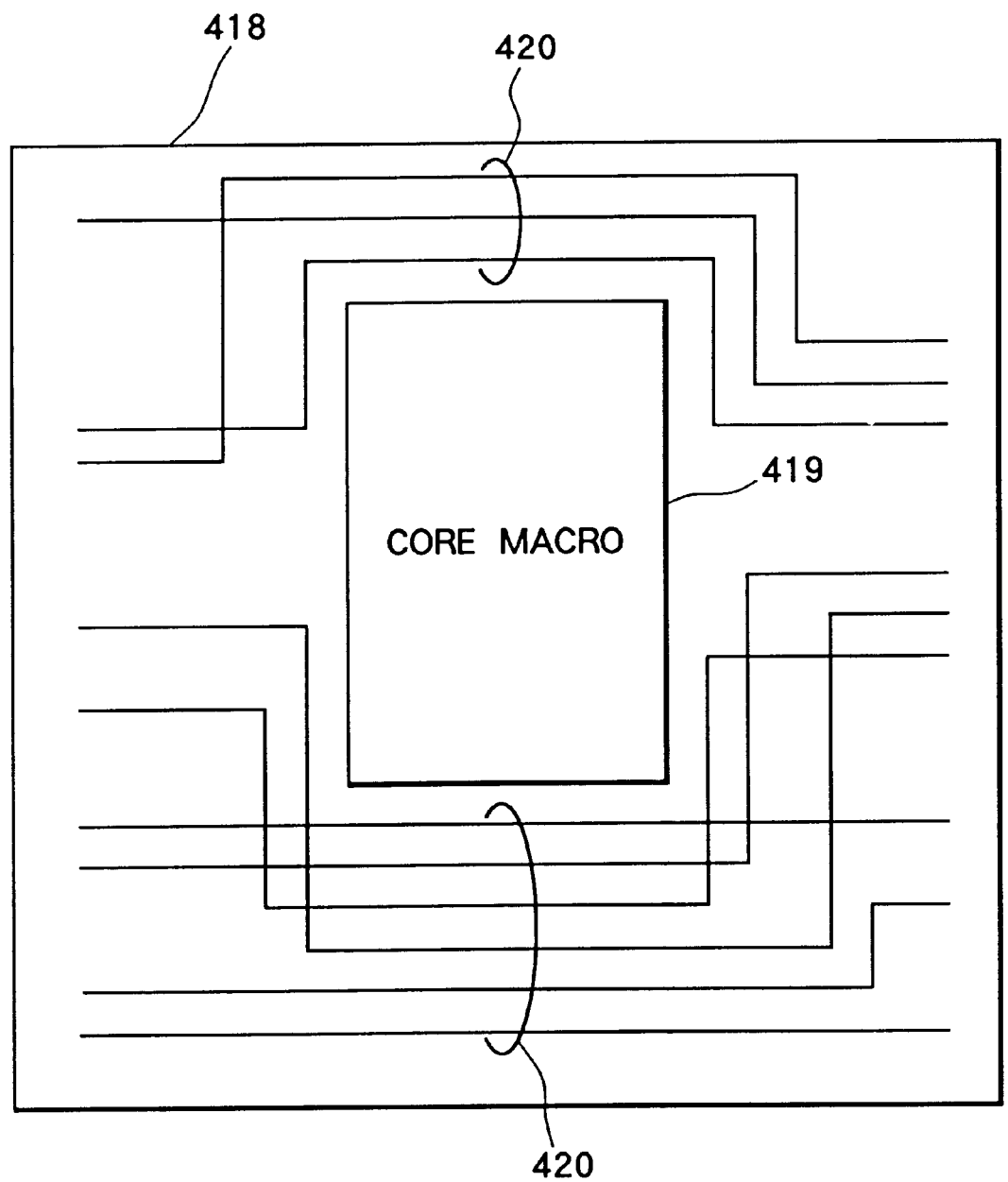
FIG. 1 is a view showing a chip layout in the prior art.
Figure 2:
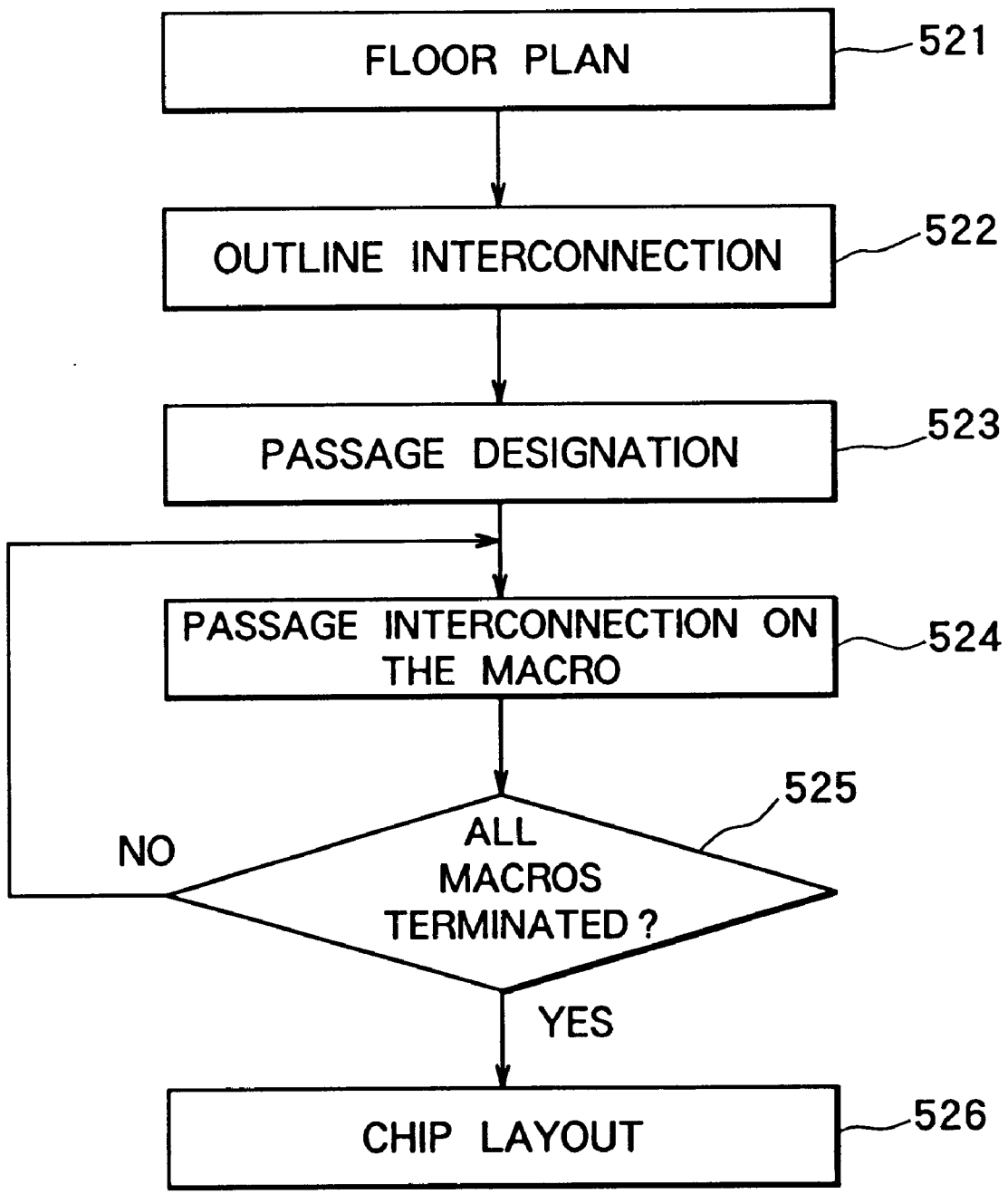
FIG. 2 is a flowchart showing a processing of a chip layout in the prior art.
Figure 3:
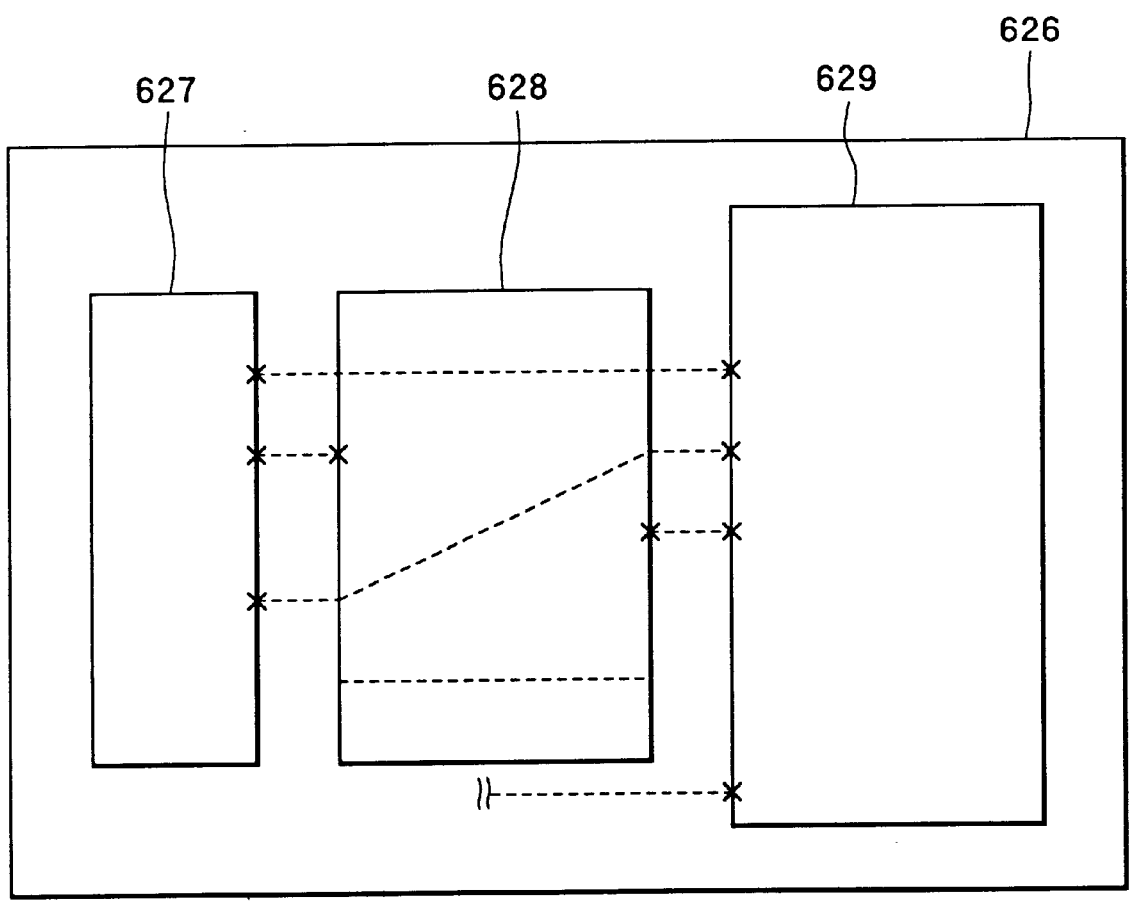
FIG. 3 is a view showing an outline interconnection in which the passage interconnection on the core macro is considered.
Figure 4:
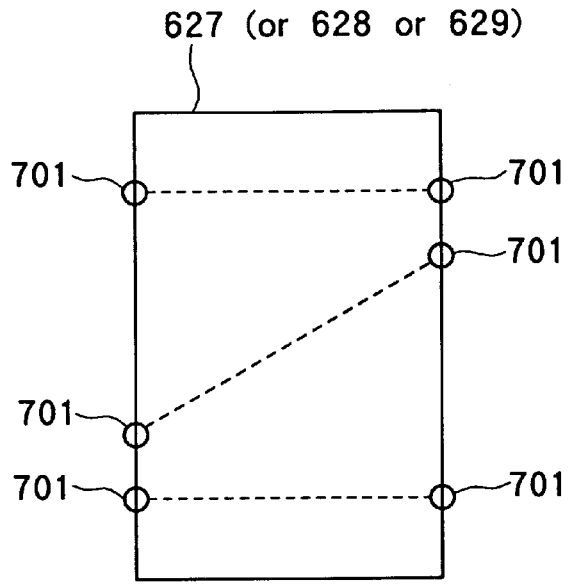
FIG. 4 is a view showing a net list for the passage on the core macro.
Figure 5:
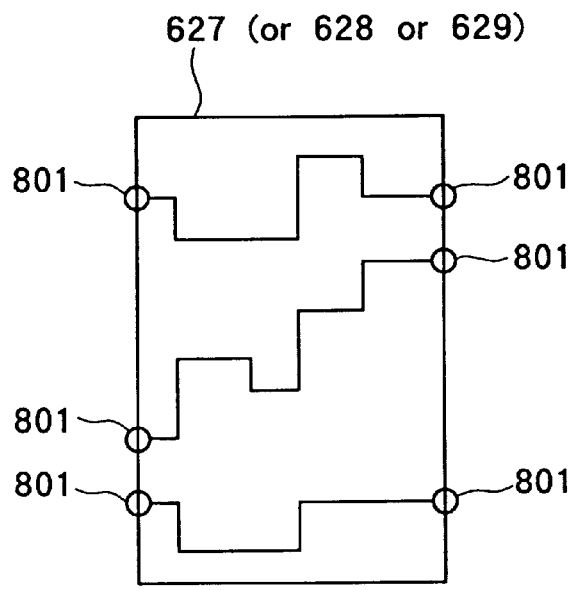
FIG. 5 is a view showing a result of passage interconnection on the core macro.
Figure 6:
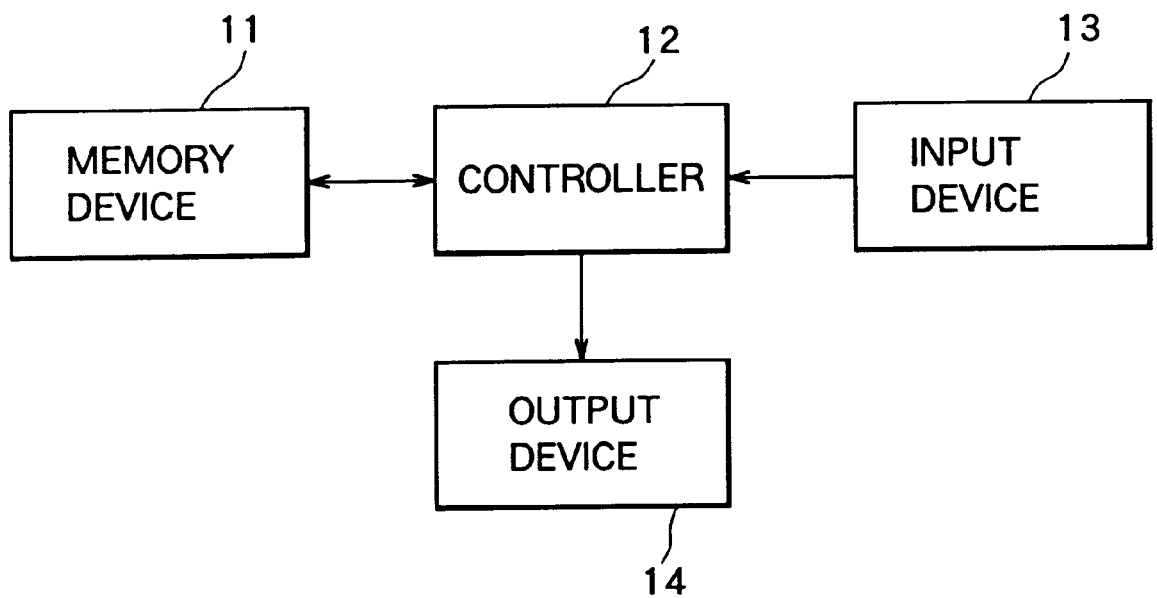
FIG. 6 is a block view showing a structure of one embodiment according to the present invention.

Next, a preferred embodiment of the present invention will be explained by using accompanied drawings. FIG. 6 is a block view showing a semiconductor integrated circuit according to the embodiment of the present invention.

The embodiment of the present invention comprises a memory device 11, a controller 12, an input device 13, and an output device 14. The input device 13 inputs a net list for carrying out a chip layout to output the net list to the controller 12. The memory device 11 temporarily memorizes a program for carrying out the chip layout and data at the time of carrying out the chip layout. The controller 12 carries out the chip layout in a processing based on the program for the chip layout which is stored in the memory device 11 with respect to the input content from the input device 13 so that the result of the chip layout is output to an output device 14 such as a printer, a display device or the like.

The aforementioned embodiment is realized in a general computer system. A general form of the program which is memorized in the memory device 11 is such that the program is stored in a detachable recording medium and is memorized via the input device 13. The present invention includes the recording medium and a semiconductor device in which the interconnection design is determined on the basis of the program.

Figure 7:
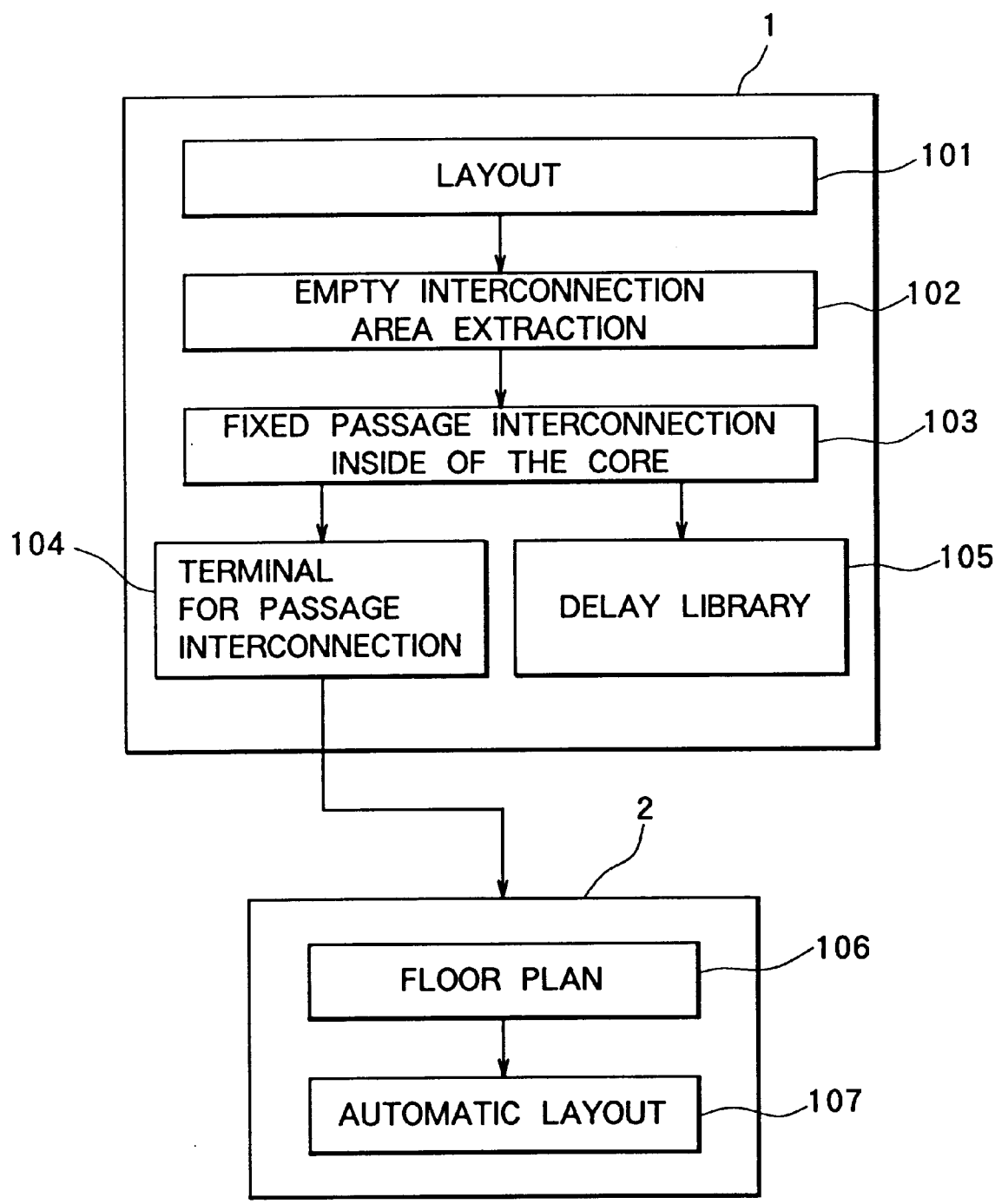
FIG. 7 is a flowchart showing a processing of the present invention.

FIG. 7 is a flowchart showing a processing which is carried out in the present invention, namely a processing procedure by means of the program which is stored in the memory device 11.

The processing which is carried out in the present embodiment comprises a core macro layout 1, and the chip layout 2 which will be carried out later.

In the core layout 1, a layout processing 101 of the core macro is carried out on the basis of the net list in the beginning, and, after that, the empty interconnection area extraction processing 102 is carried out for extracting the empty interconnection area on the core macro.

Next, the empty interconnection area which is extracted in the empty interconnection area extraction processing 102 is used as a signal interconnection area to carry out the chip layout and to carry out a fixed passage interconnection processing 103 in the core macro for preparing an interconnection.

Incidentally, in the fixed passage interconnection processing in the core macro, the interconnection is set either in the VDD potential or in the GND potential. Furthermore, in the layout processing 101, the interconnection is completely inhibited on the core macro.

Next, a delay library processing 105 is carried out for preparing a delay library in which a delay characteristic is described with respect to the core macro in which the interconnection is prepared in the fixed passage interconnection processing 103 inside of the core macro.

At the same time, the terminal processing 104 for the passage interconnection is carried out for providing a passage interconnection terminal with respect to the interconnection which has been prepared.

At the time of the chip layout 2 which is subsequently carried out, a floor plan 106 is carried out, and after that, a signal interconnection is carried out in the automatic layout 107. At this time, through the terminal for the passage interconnection which is provided in the terminal processing 105 for the passage interconnection, the interconnection is connected by using the fixed passage interconnection inside of the core macro which is prepared on the core macro in the fixed passage interconnection processing 103 inside of the core macro. The fixed passage interconnection inside of the core macro which is not used is set either in the VDD potential or in the GND potential.

According to the present invention, at the time of the preparation of the core macro, the empty interconnection area extraction on the core macro is carried out and the fixed passage in the core macro is prepared by using the empty interconnection area. At the time of the chip layout, the interconnection is provided by using the interconnection for the fixed passage in the core macro. As a consequence, the turbulence of the interconnection in the periphery of the core macro can be reduced, and the increase of the chip area can be prevented. Furthermore, at the time of the preparation of the core macro, the fixed passage interconnection in the core macro is set either in the VDD potential or in the GND potential to prepare the delay library of the core macro. Then, it becomes unnecessary to change the delay library of the core for each of the chip layout. In this manner, in the case where the chip including the core macro is laid out, the increase of the chip area can be prevented with the interconnection which makes a detour around the interconnection inhibition area on the core macro. Furthermore, in the case where the interconnection is provided by using the empty interconnection area on the core macro, the change of the AC characteristic (delay library) in the core macro can be prevented with the potential on the signal interconnection which passes on the core macro.

Next, the embodiment of the present invention will be explained in more detail.

Figure 8:
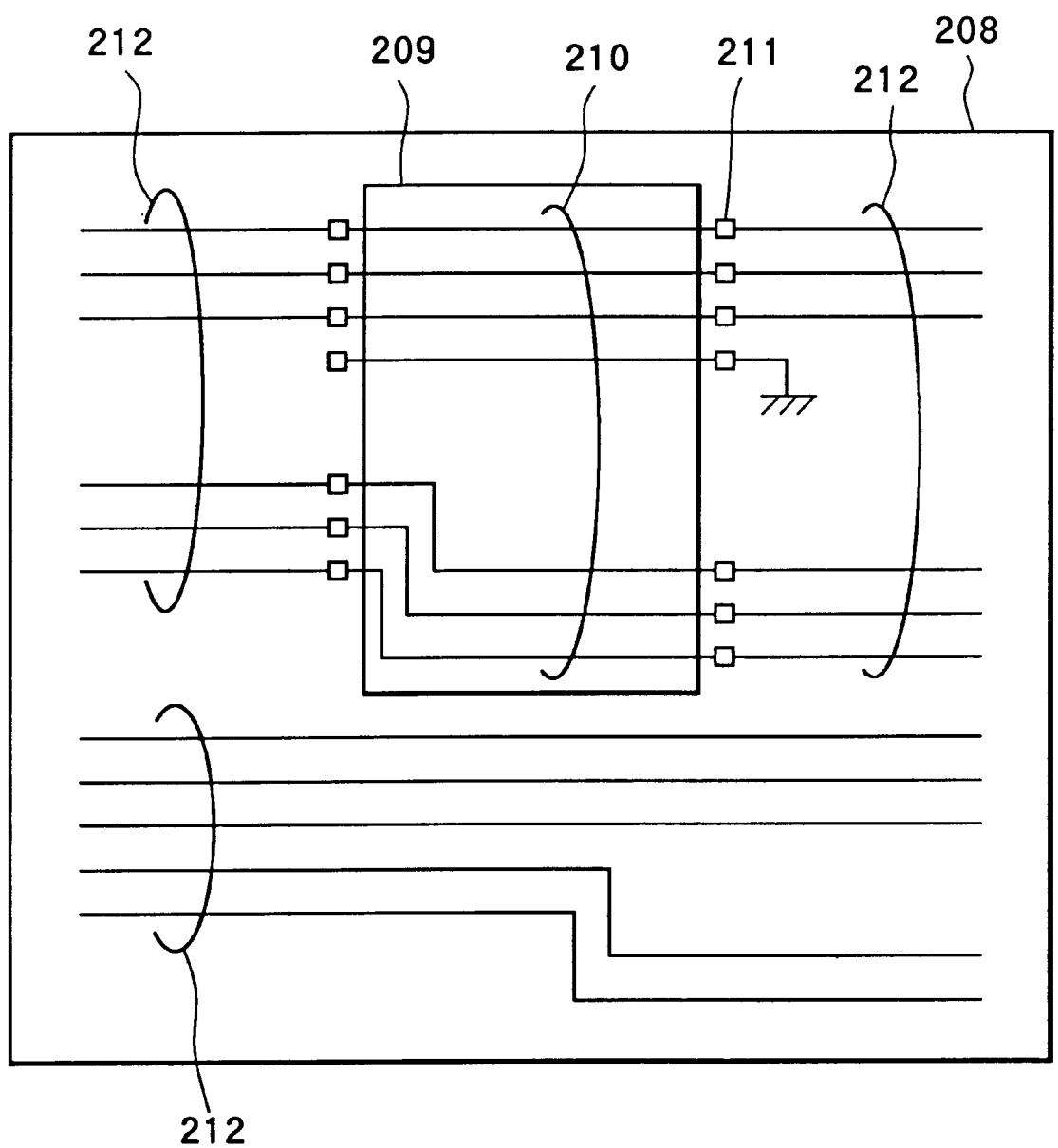
FIG. 8 is a view showing a chip layout of one embodiment of the present invention.

FIG. 8 is a chip model view of the embodiment of the present invention. A chip 208 is provided with a core macro 209. The fixed passage interconnection 210 inside of the core macro is provided in the core macro 209 and can be used by connecting the interconnection 210 with the signal interconnection 212 through the terminal 211 for the passage interconnection at the time of the chip layout. The fixed passage interconnection inside of the core macro which is not used is set either in the VDD potential or in the GND potential (GND potential in the embodiment shown in FIG. 8).

Figure 9:
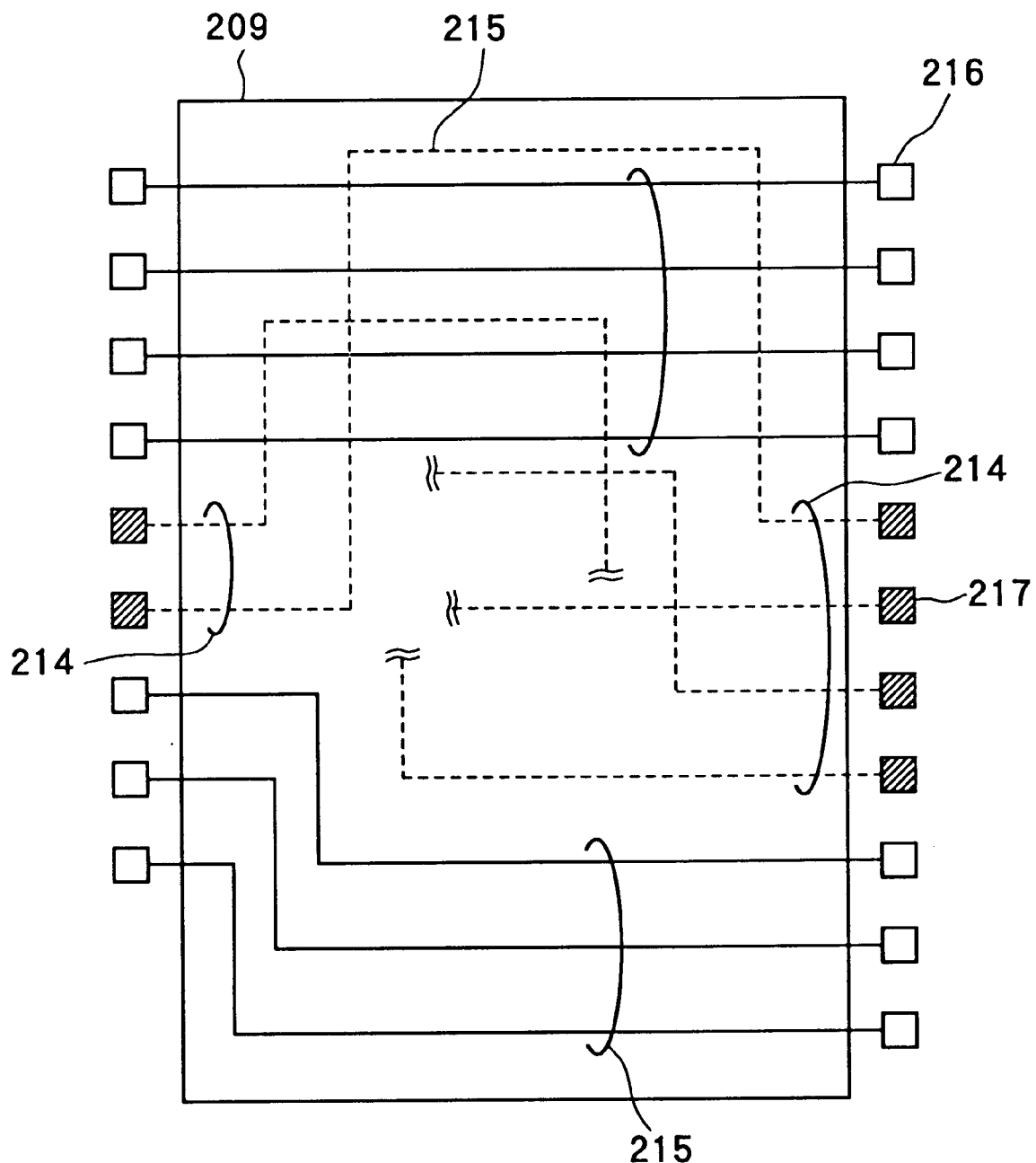
FIG. 9 is a view showing a core macro layout of one embodiment according to the present invention.

Next, a layout of the core macro 209 will be explained. FIG. 9 shows the core macro 209. The signal interconnection 214 in the core macro is automatically laid out in the beginning in order to lay out this core macro.

Next, the empty interconnection area in which the signal interconnection 214 peculiar to the core macro is not pulled is extracted, and the fixed passage interconnection 215 inside of the core macro is prepared. Then, the terminal 216 for the passage interconnection is provided on the external form of the core macro so that the fixed passage interconnection 215 inside of the core macro can be used. The interconnection is completely inhibited on the core macro. At the time of the chip layout, the terminal 217 of the core macro and the terminal 216 for the passage interconnection of the fixed interconnection 215 inside of the core macro can be recognized. Furthermore, the core macro is characterized in the state in which the fixed passage interconnection 215 inside of the core macro is prepared and the delay library of the core macro is prepared.

Next, the chip layout will be explained by referring to FIG. 8. In order to lay out the chip 208, the core macro 209 is arranged in the beginning. After that, an automatic interconnection is carried out in the same manner as the normal layout. The net list of the chip at this time contains information on the terminal 211 for the passage interconnection in the same manner as the normal terminal of the core macro. Lastly, the fixed passage interconnection 213 inside of the core macro which is not used is set either in the VDD potential or in the GND potential so that the chip layout is terminated.

In the aforementioned manner, it is possible to pass the passage interconnection on the core macro. Furthermore, it becomes unnecessary to re-prepare the delay layout of the core macro for each of the chip layout.

As described above, in the present embodiment, an area is determined in advance at the time of the core macro design wherein the signal interconnection passes, and the influence is incorporated in the delay library with the result that it is not necessary to re-prepare the delay library of the core macro for each of the chip layout. Thus, there is provided an advantage in the design time can be shortened.

Furthermore, since the empty interconnection area on the core macro can be used as the signal interconnection at the time of the chip layout using the core macro, there is provided an advantage in that the increase of the chip area of the semiconductor integrated circuit can be prevented.

What is claimed is:

1. A method of designing an interconnection of a semiconductor integrated circuit including a core macro, said method comprising carrying out a core macro processing, said core macro processing comprising:

extracting an empty area inside of said core macro; and creating a signal interconnection and its delay library with respect to the extracted empty area.

2. A method according to claim 1 further comprising a chip layout processing, said chip layout processing comprising:

connecting a signal interconnection which is created with respect to an empty area which is extracted in the core macro layout processing and the delay library.

3. A semiconductor integrated circuit in which an interconnection is determined in accordance with the method described in claim 2.

4. A recording medium wherein a program is recorded for allowing a computer to carry out the method described in claim 2.

5. A semiconductor integrated circuit in which an interconnection is determined in accordance with the method described in claim 1.

6. A recording medium wherein a program is recorded for allowing a computer to carry out the method described in claim 1.

7. A method of designing an interconnection of a semiconductor integrated circuit including a core macro, said method comprising:

processing a layout of a core macro on the basis of a net list which has been input;

extracting an empty interconnection area from within the core macro which has been laid out; and processing a fixed passage interconnection inside the core macro and creating the interconnection by using the empty interconnection area as a signal interconnection area.

8. A method of designing an interconnection of a semiconductor integrated circuit according to claim 7, the method comprising: creating a delay library in which a delay characteristic is described with respect to the core macro in which the interconnection is prepared in the fixed passage interconnection processing inside of the core macro;

providing a terminal for the passage interconnection with respect to the interconnection which has been prepared; and referring to the delay library and preparing a floor plan and an automatic layout by using the terminal and performing the signal interconnection.

9. A semiconductor integrated circuit in which an interconnection is determined in accordance with the method described in claim 8.

10. A recording medium wherein a program is recorded for allowing a computer to carry out the method described in claim 8.

11. A semiconductor integrated circuit in which an interconnection is determined in accordance with the method described in claim 7.

12. A recording medium wherein a program is recorded for allowing a computer to carry out the method described in claim 7.

\* \* \* \* \*